(12) United States Patent
Lin

(10) Patent No.: US 11,394,357 B2
(45) Date of Patent: Jul. 19, 2022

(54) AUTOMATIC GAIN CONTROL METHOD AND CIRCUIT FOR USE IN BURST-MODE TRANSIMPEDANCE AMPLIFIER

(71) Applicant: XIAMEN UX HIGH-SPEED IC CO., LTD., Fujian (CN)

(72) Inventor: Shaoheng Lin, Xiamen (CN)

(73) Assignee: XIAMEN UX HIGH-SPEED IC CO., LTD., Fujian (CN)

( * ) Notice: Subject to any disclaimer, the term of this patent is extended or adjusted under 35 U.S.C. 154(b) by 96 days.

(21) Appl. No.: 16/771,688

(22) PCT Filed: Feb. 27, 2018

(86) PCT No.: PCT/CN2018/077390
§ 371 (c)(1),
(2) Date: Jun. 11, 2020

(87) PCT Pub. No.: WO2019/140741
PCT Pub. Date: Jul. 25, 2019

(65) Prior Publication Data
US 2021/0091740 A1     Mar. 25, 2021

(30) Foreign Application Priority Data
Jan. 19, 2018     (CN) .......................... 201810054481.2

(51) Int. Cl.
*H03F 3/08*     (2006.01)
*H03G 3/30*     (2006.01)
*H04B 10/25*     (2013.01)
*H04B 10/69*     (2013.01)

(52) U.S. Cl.
CPC ........... *H03G 3/3084* (2013.01); *H04B 10/25* (2013.01); *H04B 10/69* (2013.01); *H03F 3/087* (2013.01); *H03G 2201/103* (2013.01)

(58) Field of Classification Search
CPC ........... H03G 3/3084; H03G 2201/103; H03G 1/0029; H03G 1/0088; H03G 3/3073; H03G 1/0047; H04B 10/25; H04B 10/69; H04B 10/6931; H03F 3/08; H03F 3/087; H03F 3/082
USPC ................. 330/59, 308; 250/214 A, 214 AG
See application file for complete search history.

(56) References Cited

U.S. PATENT DOCUMENTS 5,363,064 A * 11/1994 Mikamura ............... H03F 1/342
                                                      330/308
5,801,588 A *  9/1998 Nishiyama ............. H03F 3/082
                                                      330/308
6,084,478 A *  7/2000 Mayampurath .... H04B 10/6931
                                                      250/214 A
6,307,433 B1* 10/2001 Ikeda ...................... H03F 3/082
                                                      330/110
9,246,450 B2*  1/2016 Schacht .............. H03F 3/45475

* cited by examiner

*Primary Examiner* — Khanh V Nguyen
(74) *Attorney, Agent, or Firm* — Leong C. Lei

(57) ABSTRACT

Provided in the present invention is an automatic gain control method for a burst-mode transimpedance amplifier. A transistor is connected in parallel at either end of a feedback resistor of a transimpedance amplifier. A gate-source voltage of the transistor is controlled by detecting and then reversely amplifying an output voltage of the transimpedance amplifier. The present invention also provides a circuit implementing the method, obviates the need for support from any particular process, and is implementable using conventional components.

8 Claims, 3 Drawing Sheets

AUTOMATIC GAIN CONTROL METHOD AND CIRCUIT FOR USE IN BURST-MODE TRANSIMPEDANCE AMPLIFIER

BACKGROUND OF THE INVENTION

1. Field of the Invention

The present invention relates to an optical fiber communication system, and more particularly to a transimpedance amplifier.

2. Description of the Prior Art

In the modern high-speed fiber-optic communication system, TIA (Trans-Impedance Amplifier) converts and amplifies a weak photodiode current signal into a voltage signal for further use by the circuit. Placed at the most front-end of the receiver, TIA is the core component in the receiver of the fiber-optic communication system. Its core indicators, such as noise, sensitivity and dynamic range, basically determine the performance of the entire receiving system.

The typical TIA circuit structure is as shown in FIG. 1, wherein its core indicators transimpedance ZT, bandwidth f3 dB and equivalent input noise In may be deduced as:

$$Z_T = \frac{V_{OUT}}{I_{IN}} = -\frac{A}{A+1} * \frac{R_F}{1 + \frac{R_F C_{IN}}{A+1}s} \approx R_F$$

$$f_{-3\,dB} \approx \frac{1}{2\pi} \frac{A}{R_F C_{IN}}$$

$$\overline{I_{n,in}^2} = \frac{4kT}{R_F} + \frac{\overline{V_{n,A}^2}}{R_F^2}$$

Input dynamic range is also an important indicator. It is defined as the difference between the saturation input power and sensitivity. Saturation input power and sensitivity are respectively defined as the maximum and minimum input power within an acceptable range of error. Sensitivity is mainly determined by the equivalent input noise; the smaller the equivalent input noise, the higher the sensitivity. On the other hand, saturation input power is mainly determined by the output signal's pulse-width distortion, etc. It is evident from the above formula that, to obtain better sensitivity indicator, the transimpedance value RF needs to be as big as the bandwidth allows; and the greater the transimpedance, the smaller the saturation input power.

In practice, the TIA normally has an AGC (Automatic Gain Control) circuit to solve the problem, i.e. large transimpedance is maintained with smaller input power and transimpedance is automatically reduced with larger input power, ensuring that the output signal does not generate too much pulse-width distortion, thus widening the dynamic range.

AGC function normally uses an adjustable active resister placed in parallel with a feedback resistor to achieve transimpedance adjustment. There are two commonly used methods to test if the input power is so large that it causes excess output pulse-width distortion. One of which tests the TIAAC output range and the other tests changes in the TIA output DC level.

Both methods require the addition of a low-pass filter in the feedback loop to filter out high frequency component in order to maintain tranimpedance stability and reduce the jitter of the output signal. Normally, to ensure acceptable jitter, the low cutoff frequency in the AGC loop must be as low as a few dozens of KHz. As low cutoff frequency exists in the AGC loop and the low cutoff frequency is relatively low, the AGC loop requires a longer settling time, usually about a few dozens of μs. Thus, both types of AGC loops are only suitable for use in continuous communication mode.

In a PON (Passive Optical Network) system, at the OLT (Optical Line Terminal) receives signals in burst mode, i.e. dozens of ONUs (Optical Network Units) take turns to transmit signals to the OLT. As the optical power and transmission distance of each ONU is different, optical signals received by the OLT are characterized by time series bursts and optical power changes, as shown in FIG. 2.

PON primarily consists of GPON and EPON. GPON is far more difficult to achieve due to its use of NRZ coding and more stringent time series requirements. GPON is used as the example for explanation purpose. A typical GPON burst-mode data packet is as shown in FIG. 3. A burst-mode data packet is composed of preamble (36 ns), delimiter (16 ns), valid data (NRZ code) and inter-packet gap (26 ns). When the OLT receives a burst-mode data packet, the entire burst-mode receiving system must establish stable working condition within the preamble time series, i.e. 36 ns, in order to accurately process subsequent valid data signals.

Thus, if traditional AGC method is used, requiring the AGC loop to stabilize itself within 36 ns, the low cutoff frequency of the AGC feedback loop cannot be too low, theoretically not lower than 5 MHz. As NRZ is used as the GPON signal code and the longest CID (consequential identical digit) is up to 72 bits, when transmitting such code signals, the AGC loop's low cutoff frequency has to be sufficiently low to minimize DC wandering, reducing jitter. The existence of such a conflict is the reason why traditional AGC loop is not suitable for use in the burst-mode GPON receiving system.

To overcome the above-described conflict, normal burst-mode AGC control circuit will use the method shown in FIG. 4. A diode is used to control the TIA output range, i.e. when the input current reaches a certain size, TIA output voltage decreases, causing feedback resistance drop to increase until the diode is activated; the diode placed parallel to the feedback resistor Rf splits out some of the input current, ensuring that the TIA output range does not continue to surge, thus limiting the TIA output range.

However, this method has a disadvantage. The typical diode starting voltage is approximately 0.7V. Even when a MOSFET diode is used, the threshold voltage is basically above 0.4V. Normally, TIA output range has to be within 0.2 Vpp to prevent clear distortion. Thus, a special low-threshold voltage device is normally used, which will not only increase the technical cost but also requires special technical support and many commercial techniques do not support such specialized device.

SUMMARY OF THE INVENTION

The main technical problem to be solved by the present invention is to provide an automatic gain control method and circuit for a burst-mode transimpedance amplifier, which obviates the need for support from any particular technique, and is implementable using conventional components.

In order to achieve the above object, the present invention provides an automatic gain control method for a burst-mode transimpedance amplifier. A transistor is connected in parallel at either end of a feedback resistor of a transimpedance amplifier. A gate-source voltage of the transistor is controlled by detecting and then reversely amplifying an output voltage of the transimpedance amplifier.

When an input current of the transimpedance amplifier is increased, the output voltage of the transimpedance amplifier is decreased, and a source voltage of the transistor is subsequently decreased. When the output voltage of the transimpedance amplifier is decreased and then reversely amplified, a gate voltage of the transistor is increased, so that the gate-source voltage of the transimpedance amplifier is increased and the transistor is turned on. A portion of the input current flows through the transistor, thus reducing the current flowing through the feedback resistor.

The present invention further provides an automatic gain control circuit for a burst-mode transimpedance amplifier, comprising a transimpedance amplifier, a common-source amplifier, and a transistor.

Wherein, the transistor is connected in parallel with a feedback resistor of the transimpedance amplifier. A drain of the transistor is connected to an input terminal Iin of the transimpedance amplifier. A source of the transistor is connected to an output terminal Vout of the transimpedance amplifier. An input terminal of the common-source amplifier is connected to the output terminal Vout of the transimpedance amplifier. An output terminal of the common-source amplifier is connected to a gate of the transistor.

When an input current of the transimpedance amplifier is zero, the transistor is turned off. When the input current of the transimpedance amplifier is gradually increased, an output voltage of the transimpedance amplifier is gradually decreased, and an output voltage of the common-source amplifier gradually rises, so that a gate-source voltage of the transistor is gradually increased. When the gate-source voltage of the transistor increases to exceed Vth, the transistor is turned on, and an equivalent resistance of the transistor and the feedback resistor decreases, so that the output voltage of the transimpedance amplifier no longer continues to decrease as the input current increases.

In a preferable embodiment, the common-source amplifier includes an NMOS transistor M2 and a resistor R1. A gate of the NMOS transistor M2 serves as the input terminal of the common-source amplifier. A drain of the NMOS transistor M2 serves as the output terminal of the common-source amplifier. The resistor R1 is connected between the drain of the NMOS transistor M2 and a power supply voltage Vdd.

In a preferable embodiment, the common-source amplifier is a common-source differential amplifier. The common-source differential amplifier includes an NOMS transistor M4, an NMOS transistor M5, a resistor R2, a resistor R3, and a constant current source I1.

Wherein, a gate of the NOMS transistor M4 serves as an input terminal of the common-source differential amplifier. A gate of the NOMS transistor M5 is biased at a fixed reference voltage Vref. A drain of the NOMS transistor M4 serves as an output terminal of the common-source differential amplifier.

The resistors R2 and R3 are connected between the drains of the NOMS transistor M4 and the NMOS transistor M5 and a power supply voltage Vdd, respectively. Sources of the NOMS transistor M4 and the NMOS transistor M5 are connected and grounded through the current source I1.

In a preferable embodiment, the transistor is an NMOS transistor M3.

In a preferable embodiment, the transimpedance amplifier includes a feedback resistor R2 and a cascode.

In a preferable embodiment, the cascode includes an NMOS transistor M1, an NMOS transistor M0, and a resistor R0. Wherein, a gate of the NMOS transistor M1 serves as the input terminal Iin of the transimpedance amplifier. A gate of the NMOS transistor M0 is connected to a bias voltage Vbia. A drain of the NMOS transistor M1 is connected to a source of the NMOS transistor M0. A source of the NMOS transistor M1 is grounded. The feedback resistor R2 is connected between the gate of the NMOS transistor M1 and a drain of the NMOS transistor M0. The resistor R0 is connected between the drain of the NMOS transistor M0 and the power supply voltage Vdd.

Compared with the prior art, the technical solution of the present invention has the following beneficial effects:

The present invention provides an automatic gain control method and circuit for a burst-mode transimpedance amplifier. The output voltage of the transimpedance amplifier is detected, and after the first-stage reverse amplification, the gate of the transistor is controlled, so as to control whether the transistor connected in parallel with the feedback resistor is turned on or not. In this way, the output of the transimpedance amplifier, or the feedback resistor, only needs to have a small voltage drop. After the reverse amplification of the common-source amplifier, the gate voltage of the transistor will increase. The source voltage of the transistor decreases as the output voltage of the transimpedance amplifier decreases, so that the gate-source voltage of the transistor is increased enough to enable the transistor to be turned on, thereby limiting the out amplitude of the transimpedance amplifier to a certain range. Since the reverse amplification of the common-source amplifier is increased, in this structure, the transistor only needs to use a conventional NMOS transistor with a normal threshold, which greatly reduces the process cost and increases the flexibility of process selection.

In addition, this structure does require the low-pass filter of the AGC control loop, thereby achieving ultra-fast, real-time gain control; and Bit-by-bit control is implemented to avoid the DC wandering generated when encountering the longest CID (consequential identical digit).

DETAILED DESCRIPTION OF THE PREFERRED EMBODIMENTS

Embodiments of the present invention will now be described, by way of example only, with reference to the accompanying drawings.

Provided in the present invention is an automatic gain control method for a burst-mode transimpedance amplifier. One transistor is connected in parallel at either end of a feedback resistor of a transimpedance amplifier. A gate-source voltage of the transistor is controlled by detecting and then reversely amplifying an output voltage of the transimpedance amplifier.

When an input current of the transimpedance amplifier is increased, the output voltage of the transimpedance amplifier is decreased, and a source voltage of the transistor is subsequently decreased; when the output voltage of the transimpedance amplifier is decreased and then reversely amplified, a gate voltage of the transistor is increased; this allows the gate-source voltage of the transimpedance amplifier to be increased and the transistor to be turned on; a portion of the input current flows through the transistor, thus reducing the current flowing through the feedback resistor.

The output voltage of the transimpedance amplifier is detected, and after the first-stage reverse amplification, the gate of the transistor is controlled, so as to control whether the transistor connected in parallel with the feedback resistor is turned on or not. In this way, the output of the transimpedance amplifier, or the feedback resistor, only needs to have a small voltage drop. After the reverse amplification of the common-source amplifier, the gate voltage of the transistor will increase. The source voltage of the transistor decreases as the output voltage of the transimpedance amplifier decreases, so that the gate-source voltage of the transistor is increased enough to enable the transistor to be turned on, thereby limiting the out amplitude of the transimpedance amplifier to a certain range. Since the reverse amplification of the common-source amplifier is increased, in this structure, the transistor only needs to use a conventional NMOS transistor with a normal threshold, which greatly reduces the technical cost and increases the flexibility of technical devices.

In order to realize the above control method, the present invention provides two embodiments.

Embodiment 1

Figure 1:
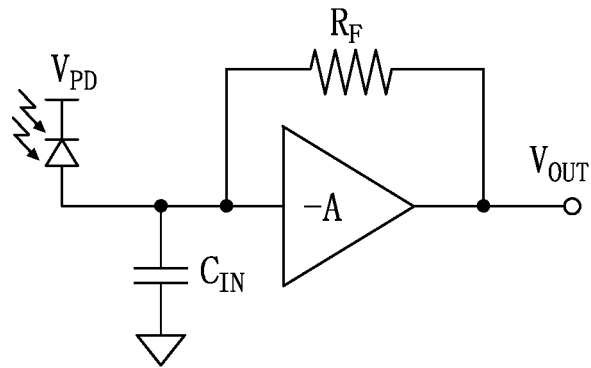
FIG. 1 is a circuit diagram of a conventional transimpedance amplifier.
Figure 2:
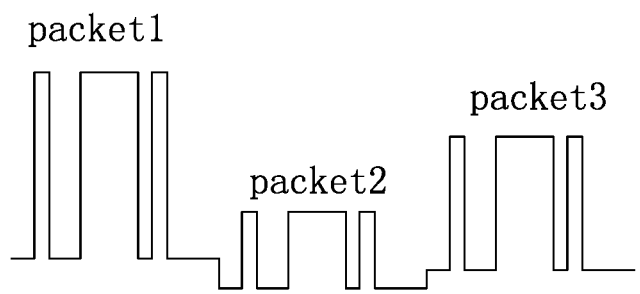
FIG. 2 is a schematic view of a conventional burst-mode signal packet.
Figure 3:
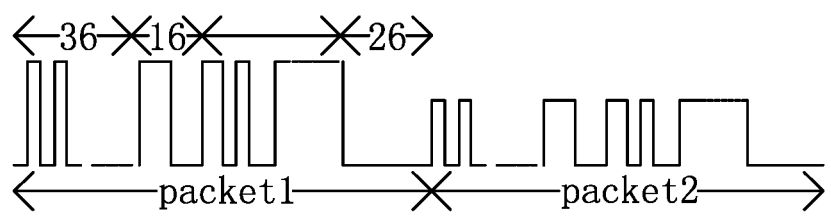
FIG. 3 is a schematic view of a conventional GPON burst-mode data packet.
Figure 4:
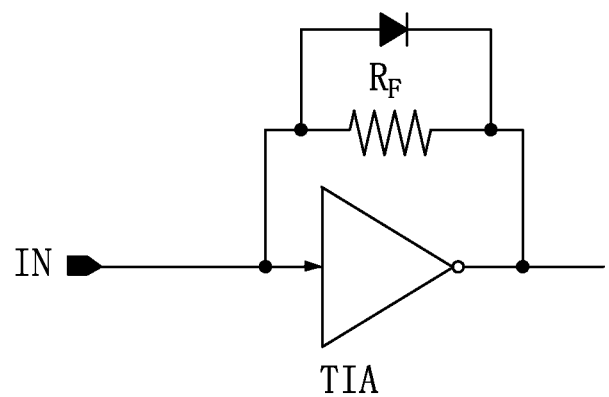
FIG. 4 is a circuit diagram of a conventional automatic gain control using a diode.
Figure 5:
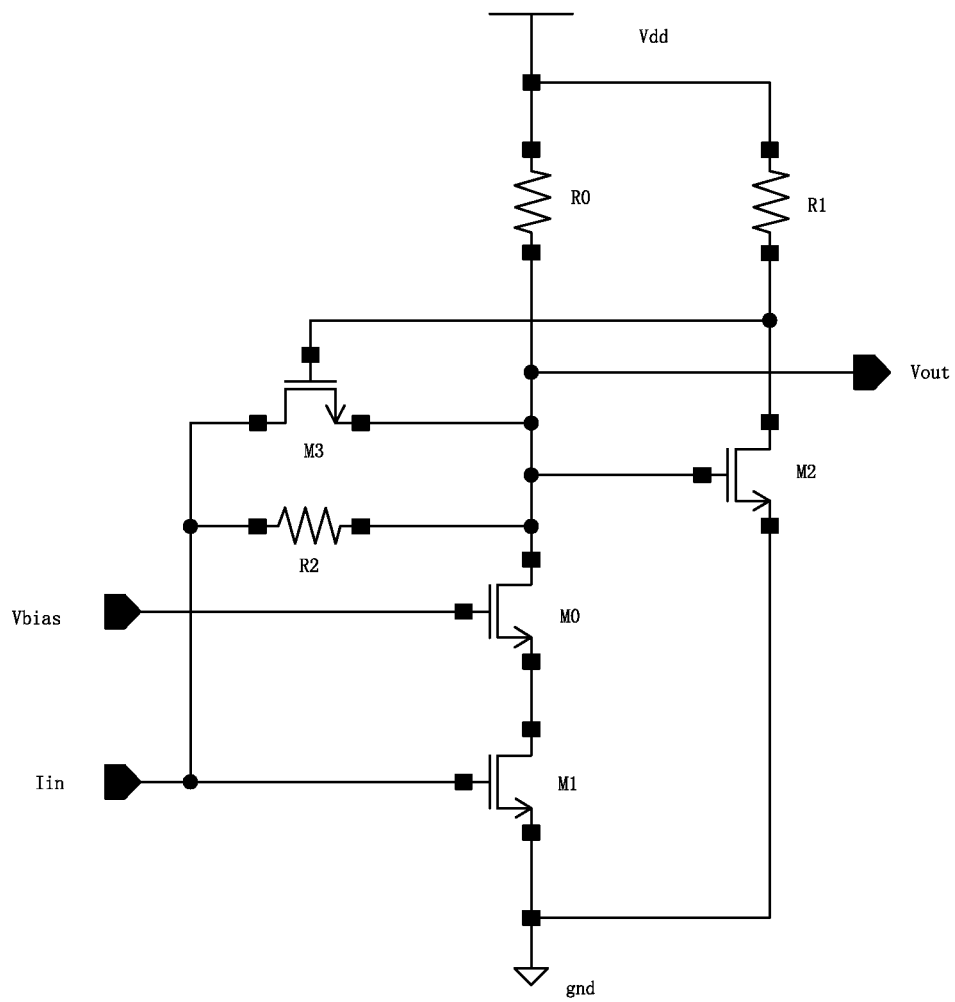
FIG. 5 is a circuit diagram of a first embodiment of the present invention.
Figure 6:
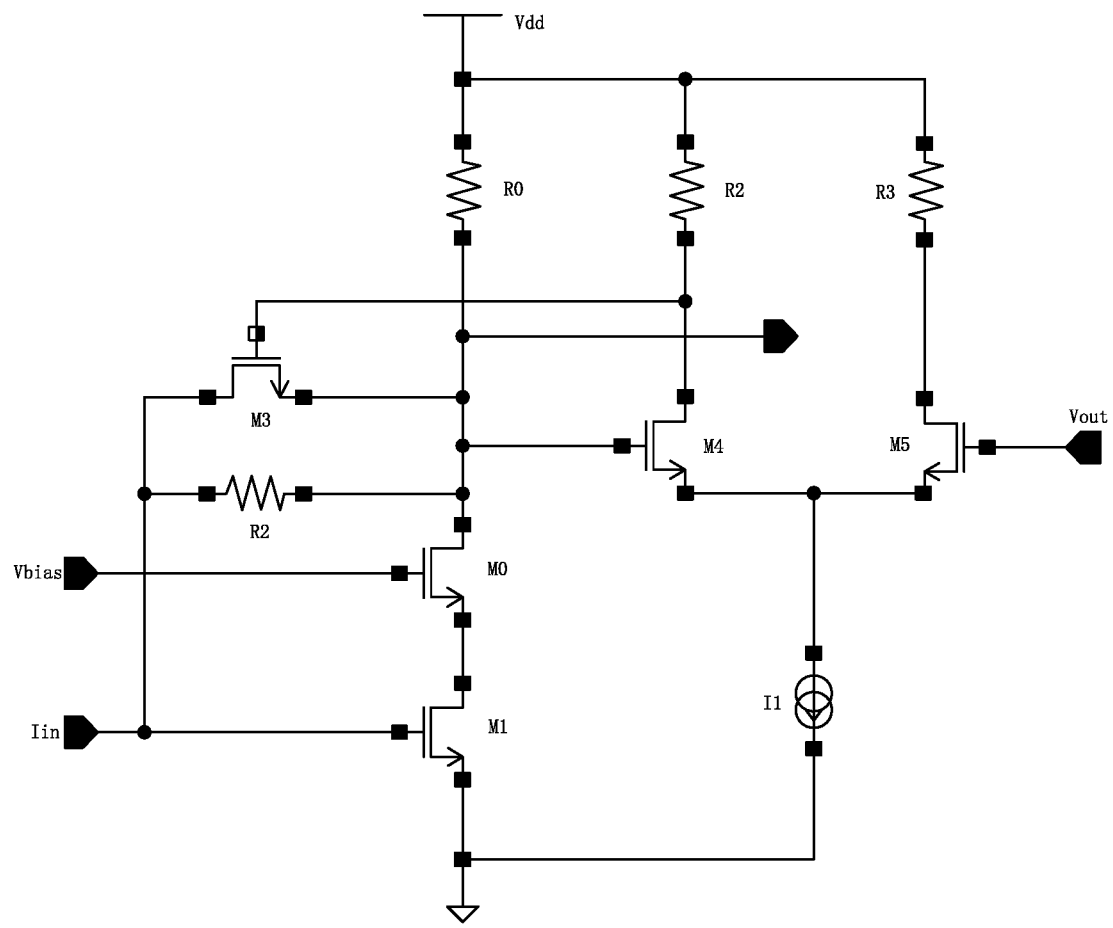
FIG. 6 is a circuit diagram of a second embodiment of the present invention.

Referring to FIG. 5, an automatic gain control circuit for a burst-mode transimpedance amplifier comprises a transimpedance amplifier, a common-source amplifier, and an NMOS transistor M3.

The transimpedance amplifier includes a feedback resistor R2 and a cascode. The cascode includes an NMOS transistor M1, an NMOS transistor M0, and a resistor R0. Wherein, a gate of the NMOS transistor M1 serves as an input terminal Iin of the transimpedance amplifier. A gate of the NMOS transistor M0 is connected to a bias voltage Vbia. A drain of the NMOS transistor M1 is connected to a source of the NMOS transistor M0. A source of the NMOS transistor M1 is grounded. The feedback resistor R2 is connected between the gate of the NMOS transistor M1 and a drain of the NMOS transistor M0. The resistor R0 is connected between the drain of the NMOS transistor M0 and a power supply voltage Vdd. As a simple replacement of this embodiment, the cascode may use other structures, which does not affect the implementation of this embodiment and belongs to the simple replacement of this embodiment.

The common-source amplifier includes an NMOS transistor M2 and a resistor R1. A gate of the NMOS transistor M2 serves as an input terminal of the common-source amplifier. A drain of the NMOS transistor M2 serves as an output terminal of the common-source amplifier. The resistor R1 is connected between the drain of the NMOS transistor M2 and the power supply voltage Vdd.

The NMOS transistor M3 is connected in parallel with the feedback resistor R2 of the transimpedance amplifier. A drain of the NMOS transistor M3 is connected to the input terminal Iin of the transimpedance amplifier. A source of the NMOS transistor M3 is connected to an output terminal Vout of the transimpedance amplifier. The input terminal of the common-source amplifier is connected to the output terminal Vout of the transimpedance amplifier. The output terminal of the common-source amplifier is connected to a gate of the NMOS transistor M3.

When the input current of the transimpedance amplifier is zero, by properly setting the parameters of each device, the NMOS transistor M3 is turned off. When the input current of the transimpedance amplifier is gradually increased, the output voltage of the transimpedance amplifier is gradually decreased, so that the source voltage of the NMOS transistor M3 is subsequently decreased. Since the output terminal of the transimpedance amplifier serves as the input terminal of the common-source amplifier, after the reverse amplification of the common-source amplifier, the output voltage of the common-source amplifier gradually rises, so that the gate voltage of the NMOS transistor M3 rises accordingly. Therefore, the gate-source voltage of NMOS transistor M3 gradually increases. When the gate-source voltage of the NMOS transistor M3 increases to exceed Vth, the NMOS transistor M3 is turned on, and an equivalent resistance of the NMOS transistor M3 and the feedback resistor R2 decreases, so that the output voltage of the transimpedance amplifier no longer continues to decrease as the input current increases, thereby limiting the output amplitude of the transimpedance amplifier to a certain range.

Embodiment 2

The difference between the second embodiment and the first embodiment is that in the second embodiment, the common-source amplifier is a common-source differential amplifier, including an NOMS transistor M4, an NMOS transistor M5, a resistor R2, a resistor R3, and a constant current source I1.

Wherein, a gate of the NOMS transistor M4 serves as an input terminal of the common-source differential amplifier. A gate of the NOMS transistor M5 is biased at a fixed reference voltage Vref. A drain of the NOMS transistor M4 serves as an output terminal of the common-source differential amplifier.

The resistors R2 and R3 are connected between the drains of the NOMS transistor M4 and the NMOS transistor M5 and the power supply voltage Vdd, respectively. Sources of the NOMS transistor M4 and the NMOS transistor M5 are connected and grounded through the current source I1.

When the input current of the transimpedance amplifier is zero, by properly setting the parameters of each device, the NMOS transistor M3 is turned off. When the input current of the transimpedance amplifier is gradually increased, the source voltage of the NMOS transistor M3 is subsequently decreased. Since the output terminal of the transimpedance amplifier serves as the input terminal of the common-source amplifier, after the reverse amplification of the common-source amplifier, the output voltage of the common-source amplifier gradually rises, so that the gate voltage of the NMOS transistor M3 rises accordingly. Therefore, the gate-source voltage of NMOS transistor M3 gradually increases. When the gate-source voltage of the NMOS transistor M3 increases to exceed Vth, the NMOS transistor M3 is turned on, and an equivalent resistance of the NMOS transistor M3 and the feedback resistor R2 decreases, so that the output voltage of the transimpedance amplifier no longer continues to decrease as the input current increases, thereby limiting the out amplitude of the transimpedance amplifier to a certain range.

Since the common-source differential amplifier is used in this embodiment, and the gate of the NOMS transistor M5 of the common-source differential amplifier is biased at the fixed reference voltage Vref, compared with the first embodiment, it is easier to accurately set the corresponding input current threshold when the NMOS transistor M3 is turned on. The other parts are the same as those in the first embodiment, and are not repeated here.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An automatic gain control circuit for a burst-mode transimpedance amplifier, comprising a transimpedance amplifier, a common-source amplifier, and a transistor;
    wherein the transistor is connected in parallel with a feedback resistor of the transimpedance amplifier, a drain of the transistor is connected to an input terminal Iin of the transimpedance amplifier, a source of the transistor is connected to an output terminal Vout of the transimpedance amplifier; an input terminal of the common-source amplifier is connected to the output terminal Vout of the transimpedance amplifier, an output terminal of the common-source amplifier is connected to a gate of the transistor;
    when an input current of the transimpedance amplifier is zero, the transistor is turned off; when the input current of the transimpedance amplifier is gradually increased, an output voltage of the transimpedance amplifier is gradually decreased, and an output voltage of the common-source amplifier gradually rises, so that a gate-source voltage of the transistor is gradually increased; when the gate-source voltage of the transistor increases to exceed Vth, the transistor is turned on, and an equivalent resistance of the transistor and the feedback resistor decreases, so that the output voltage of the transimpedance amplifier no longer continues to decrease as the input current increases;
    wherein the common-source amplifier includes an NMOS transistor (M2) and a resistor (R1); a gate of the NMOS transistor (M2) serves as the input terminal of the common-source amplifier, a drain of the NMOS transistor (M2) serves as the output terminal of the common-source amplifier; and the resistor (R1) is connected between the drain of the NMOS transistor (M2) and a power supply voltage Vdd.

2. The automatic gain control circuit as claimed in claim 1, wherein the common-source amplifier is a common-source differential amplifier; the common-source differential amplifier includes an NOMS transistor (M4), an NMOS transistor (M5), a resistor (R2), a resistor (R3), and a constant current source (I1);
    wherein a gate of the NOMS transistor (M4) serves as an input terminal of the common-source differential amplifier, a gate of the NOMS transistor (M5) is biased at a fixed reference voltage Vref; a drain of the NOMS transistor (M4) serves as an output terminal of the common-source differential amplifier;
    the resistors (R2) and (R3) are connected between the drains of the NOMS transistor (M4) and the NMOS transistor (M5) and a power supply voltage Vdd, respectively, sources of the NOMS transistor (M4) and the NMOS transistor (M5) are connected and grounded through the current source (I1).

3. The automatic gain control circuit as claimed in claim 2, wherein the transistor is an NMOS transistor (M3).

4. The automatic gain control circuit as claimed in claim 3, wherein the transimpedance amplifier includes a feedback resistor (R2) and a cascode.

5. The automatic gain control circuit as claimed in claim 4, wherein the cascode includes an NMOS transistor (M1), an NMOS transistor (MO), and a resistor (R0); wherein a gate of the NMOS transistor (M1) serves as the input terminal Iin of the transimpedance amplifier, a gate of the NMOS transistor (MO) is connected to a bias voltage Vbia; a drain of the NMOS transistor (M1) is connected to a source of the NMOS transistor (MO), a source of the NMOS transistor (M1) is grounded; the feedback resistor (R2) is connected between the gate of the NMOS transistor (M1) and a drain of the NMOS transistor (MO); the resistor (RO) is connected between the drain of the NMOS transistor (MO) and the power supply voltage Vdd.

6. The automatic gain control circuit as claimed in claim 2, wherein the transistor is an NMOS transistor (M3).

7. The automatic gain control circuit as claimed in claim 6, wherein the transimpedance amplifier includes the feedback resistor (R2) and a cascode.

8. The automatic gain control circuit as claimed in claim 7, wherein the cascode includes an NMOS transistor (M1), an NMOS transistor (MO), and a resistor (R0); wherein a gate of the NMOS transistor (M1) serves as the input terminal Iin of the transimpedance amplifier, a gate of the NMOS transistor (MO) is connected to a bias voltage Vbias; a drain of the NMOS transistor (M1) is connected to a source of the NMOS transistor (MO), a source of the NMOS transistor (M1) is grounded; the feedback resistor (R2) is connected between the gate of the NMOS transistor (M1) and a drain of the NMOS transistor (MO); the resistor (R0) is connected between the drain of the NMOS transistor (MO) and the power supply voltage Vdd.

* * * * *